United States Patent
Gu et al.

(10) Patent No.: US 10,121,437 B2
(45) Date of Patent: Nov. 6, 2018

(54) SHIFT REGISTER AND METHOD FOR DRIVING THE SAME, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Honggang Gu, Beijing (CN); Xiaohe Li, Beijing (CN); Xianjie Shao, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 164 days.

(21) Appl. No.: 15/131,527

(22) Filed: Apr. 18, 2016

(65) Prior Publication Data
US 2016/0343338 A1   Nov. 24, 2016

(30) Foreign Application Priority Data
May 21, 2015   (CN) .......................... 2015 1 0262974

(51) Int. Cl.
*G11C 19/28*   (2006.01)
*G09G 3/36*   (2006.01)

(52) U.S. Cl.
CPC ......... *G09G 3/3677* (2013.01); *G11C 19/287* (2013.01); *G09G 2310/0286* (2013.01); *G09G 2330/06* (2013.01)

(58) Field of Classification Search
None
See application file for complete search history.

(56) References Cited

U.S. PATENT DOCUMENTS

| 9,396,813 B2* | 7/2016 | Tan ........................ G11C 19/28 |
| 2008/0101529 A1* | 5/2008 | Tobita .................. G09G 3/3677 377/64 |

(Continued)

FOREIGN PATENT DOCUMENTS

| CN | 103440839 A | 12/2013 |
| CN | 103474038 A | 12/2013 |

(Continued)

OTHER PUBLICATIONS

Office Action dated Oct. 9, 2016 issued in corresponding Chinese Application No. 201510262974.1.

*Primary Examiner* — Tuan T Lam
(74) *Attorney, Agent, or Firm* — Nath, Goldberg & Meyer; Joshua B. Boldberg

(57) ABSTRACT

The present invention provides a shift register and a method for driving the same, a gate driving circuit and a display device, and belongs to the field of display technology. The shift register of the present invention includes an input module, an output pulling-up module and a reset-and-noise-reducing module, wherein the input module is connected to a signal input terminal, a second clock signal input terminal, a power supply voltage terminal and a pulling-up node, the output pulling-up module is connected to a first clock signal input terminal, the pulling-up node and a signal output terminal, and the reset-and-noise-reducing module is connected to the second clock signal input terminal, a reset signal input terminal, a low voltage terminal, the pulling-up node and the signal output terminal. The shift register of the present invention has a simple structure, thereby facilitating the implementation of a narrow-bezel display device.

6 Claims, 5 Drawing Sheets

(56) References Cited

U.S. PATENT DOCUMENTS

| | | | |
|---|---|---|---|
| 2011/0058640 A1* | 3/2011 | Shang | G11C 19/184 377/64 |
| 2012/0113088 A1* | 5/2012 | Han | G09G 3/3674 345/212 |
| 2014/0079173 A1* | 3/2014 | Yan | G11C 19/28 377/64 |
| 2014/0119491 A1* | 5/2014 | Liu | G11C 19/28 377/64 |
| 2014/0133621 A1* | 5/2014 | Shang | G11C 19/184 377/67 |
| 2015/0043703 A1* | 2/2015 | Tan | G11C 19/28 377/68 |
| 2015/0269899 A1* | 9/2015 | Ma | G09G 3/20 345/213 |
| 2016/0049128 A1* | 2/2016 | Shao | G09G 3/3677 345/204 |
| 2016/0225336 A1* | 8/2016 | Gu | G11C 19/28 |
| 2016/0293091 A1* | 10/2016 | Wang | G09G 3/36 |
| 2016/0314850 A1* | 10/2016 | Gu | G11C 19/28 |

FOREIGN PATENT DOCUMENTS

| | | |
|---|---|---|
| CN | 203422915 U | 2/2014 |
| CN | 104091574 A | 10/2014 |
| CN | 104240766 A | 12/2014 |
| CN | 104299594 A | 1/2015 |
| CN | 104464645 A | 3/2015 |
| CN | 104575429 A | 4/2015 |
| CN | 104637462 A | 5/2015 |
| KR | 10-2014-0098880 A | 8/2014 |
| KR | 10-2015-0014619 A | 2/2015 |

* cited by examiner

SHIFT REGISTER AND METHOD FOR DRIVING THE SAME, GATE DRIVING CIRCUIT AND DISPLAY DEVICE

FIELD OF THE INVENTION

The present invention belongs to the field of display technology, and specifically relates to a shift register and a method for driving the same, a gate driving circuit and a display device.

BACKGROUND OF THE INVENTION

A fundamental principle for a TFT-LCD (thin film transistor-Liquid Crystal Display) to realize the display of one frame of image is that respective pixels are gated by the means of providing, to each row of pixels sequentially from top to bottom, a square wave having certain width by a gate driving circuit, and then required signals are outputted to each of the gated rows of pixels by a source driving circuit, respectively. In conventional processes for manufacturing the above TFT-LCD, the gate driving circuit and the source driving circuit are generally manufactured on a glass panel by a Chip-On-Film (COF) process or a Chip-On-Glass (COQ in which a chip is directly fixed onto a glass) process. As a resolution of the display becomes higher, however, outputs of the gate driving circuit and the source driving circuit become numerous and areas of the driving circuits will be increased, which is disadvantage to a bonding operation for the driving circuits.

In order to overcome the above problems, a design of Gate driver On Array (GOA) circuit is used in the manufacture of conventional display devices. Compared to conventional COF or COG process, the GOA circuit is not only cost-saving but also better-looking symmetrically at both sides of the panel, and also saves the bonding area of the gate driving circuit as well as a peripheral wiring space, thereby implementing a narrow-bezel design of the display device and improving capacity and yield of the display devices. However, there are some problems in the conventional GOA circuit. As shown in FIG. 1, each shift register in a conventional GOA circuit has a large amount of thin-film transistors (TFT), i.e., M1-M6 and M8-M11, and each shift register is only used to drive a gate line of one row of pixels, thereby a large space is occupied by the GOA circuit. Therefore, a narrow-bezel design of the display device can't be truly implemented until the space occupied by the GOA circuit is further reduced.

SUMMARY OF THE INVENTION

In view of the problems existing in conventional shift registers, the present invention provides a shift register having a simple structure and an excellent performance, a method for driving the same, a gate driving circuit and a display device.

The technical solution used for solving the technical problems in the present invention is a shift register, which includes an input module, an output pulling-up module and a reset-and-noise-reducing module, wherein, the input module is connected to a signal input terminal, a second clock signal input terminal, a power supply voltage terminal and a pulling-up node, and is used to charge the pulling-up node through a power supply voltage inputted from the power supply voltage terminal and a signal inputted from the signal input terminal, under the control of the signal inputted from the signal input terminal and a second clock signal inputted from the second clock signal input terminal, the pulling-up node being a connection node between the input module and the output pulling-up module;

the output pulling-up module is connected to a first clock signal input terminal, the pulling-up node and a signal output terminal, and is used to pull up a potential at the signal output terminal in accordance with a potential at the pulling-up node; and the reset-and-noise-reducing module is connected to the second clock signal input terminal, a reset signal input terminal, a low voltage terminal, the pulling-up node and the signal output terminal, and is used to reset the pulling-up node and a signal outputted from the signal output terminal and reduce output noise through a low-voltage signal inputted from the low voltage terminal, under the control of the second clock signal inputted from the second clock signal input terminal and a reset signal inputted from the reset signal input terminal.

Preferably, the shift register further includes an assistant noise-reducing module, the assistant noise-reducing module is connected to the first clock signal input terminal and the reset-and-noise-reducing module, and is used to assist the reset-and-noise-reducing module to perform the reset and noise reduction for the pulling-up node and the signal output terminal, under the control of the first clock signal inputted from the first clock signal input terminal.

Preferably, the shift register further includes a pulling-down module, the pulling-down module is connected to a pulling-down node, the pulling-up node and the low voltage terminal, and is used to pull down a potential at the pulling-down node through the low-voltage signal inputted from the low voltage terminal, under the control of the pulling-up node, the pulling-down node being a connection node between the reset-and-noise-reducing module and the pulling-down module.

Preferably, the input module includes a first transistor and a fifth transistor; wherein, a first electrode of the first transistor is connected to the power supply voltage terminal, a second electrode of the first transistor is connected to the pulling-up node, and a control electrode of the first transistor is connected to the signal input terminal; and a first electrode of the fifth transistor is connected to the signal input terminal, a second electrode of the fifth transistor is connected to the pulling-up node, and a control electrode of the fifth transistor is connected to the second clock signal input terminal.

Preferably, the output pulling-up module includes a third transistor and a first storage capacitor; wherein, a first electrode of the third transistor is connected to the first clock signal input terminal, a second electrode of the third transistor is connected to the signal output terminal, and a control electrode of the third transistor is connected to the pulling-up node; and a first end of the first storage capacitor is connected to the pulling-up node, and a second end of the first storage capacitor is connected to the signal output terminal.

Preferably, the reset-and-noise-reducing module includes a second transistor, a fourth transistor and a second storage capacitor, wherein, a first electrode of the second transistor is connected to the pulling-up node, a second electrode of the second transistor is connected to the low voltage terminal, and a control electrode of the second transistor is connected to the reset signal input terminal;

a first electrode of the fourth transistor is connected to the signal output terminal, a second electrode of the fourth transistor is connected to the low voltage terminal, and a control electrode of the fourth transistor is connected to the pulling-down node; and a first end of the second storage capacitor is connected to the second clock signal input terminal, and a second end of the second storage capacitor is connected to the control electrode of the fourth transistor.

Preferably, the assistant noise-reducing module includes a third storage capacitor, wherein, a first end of the third storage capacitor is connected to the first clock signal input terminal, and a second end of the third storage capacitor is connected to the pulling-down node.

Preferably, the pulling-down module includes a sixth transistor, a first electrode of the sixth transistor is connected to the pulling-down node, a second electrode of the sixth transistor is connected to the low voltage terminal, and a control electrode of the sixth transistor is connected to the pulling-up node.

The technical solution used for solving the technical problems in the present invention is a method for driving the above shift register provided in the present invention, the method includes steps of:

inputting, in a pre-charging period, high-level signals from the signal input terminal of the input module and the second clock signal input terminal, and charging the pulling-up node through the power supply voltage inputted from the power supply voltage terminal and the high-level signal inputted from the signal input terminal;

turning on, in an outputting period, the output pulling-up module by the pulling-up node, and pulling up a voltage at the signal output terminal through a signal inputted from the first clock signal input terminal; and resetting, in a reset-and-noise reducing period, the pulling-up node and the signal outputted from the signal output terminal, and reducing the noise thereof, through the low-voltage signal inputted from the low voltage terminal, under the control of the second clock signal inputted from the second clock signal input terminal and the reset signal inputted from the reset signal input terminal.

The technical solution used for solving the technical problems in the present invention is a gate driving circuit including a plurality of cascaded above-mentioned shift registers.

The technical solution used for solving the technical problems in the present invention is a display device including the above-mentioned gate driving circuit.

The beneficial effect of the present invention is as follows:

Since the shift register in the present invention only comprises an input module, an output pulling-up module and a reset-and-noise-reducing module, the shift register has a simple structure, which facilitates implementing a narrow-bezel display device. The method for driving the shift register in the present invention has a simple timing and is easily implemented.

DETAILED DESCRIPTION OF THE EMBODIMENTS

To make those skilled in the art better understand the technical solutions of the present invention, the present invention will be further described in detail below in conjunction with the accompanying drawings and specific implementations.

The transistors used in the embodiments of the present invention may be thin-film transistors or field-effect transistors, or other types of transistors having the same function, and source and drain of a transistor used in the embodiments of the present invention are not distinguished due to the symmetry of the source and the drain. In the embodiments of the present invention, in order to distinguish the source and the drain of the transistor, one of the source and the drain is referred to as a first electrode, and the other is referred to as a second electrode, and the gate of the transistor is referred to as a control electrode. In addition, the transistors can be classified to P-type transistors and N-type transistors in accordance with the conductivity characteristics thereof, and the embodiments below are described by taking N-type transistors as an example. When using N-type transistors, the first electrode is the source of the N-type transistor, and the second electrode is the drain of the N-type transistor, and the N-type transistor will be turned on when a high level is applied to the gate thereof; it is on the contrary for the P-type transistor. It should be understood that using P-type transistor to implement the concepts of the present invention is obvious to those skilled in the art, thereby falling into the protection scope of the embodiments of the present invention.

First Embodiment

Figure 1:
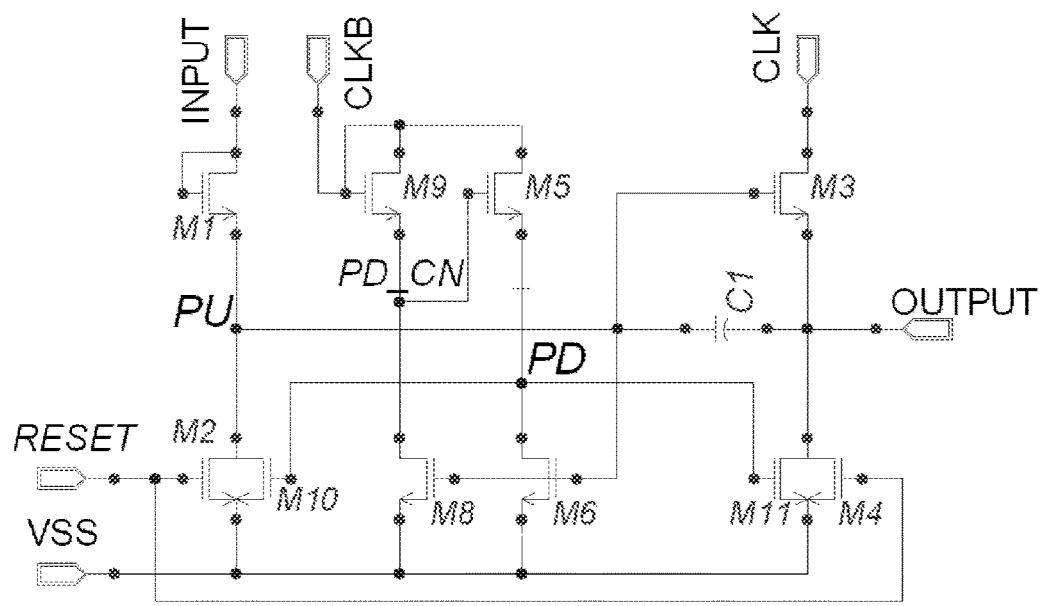
FIG. 1 is a circuit schematic diagram of a conventional shift register.
Figure 2:
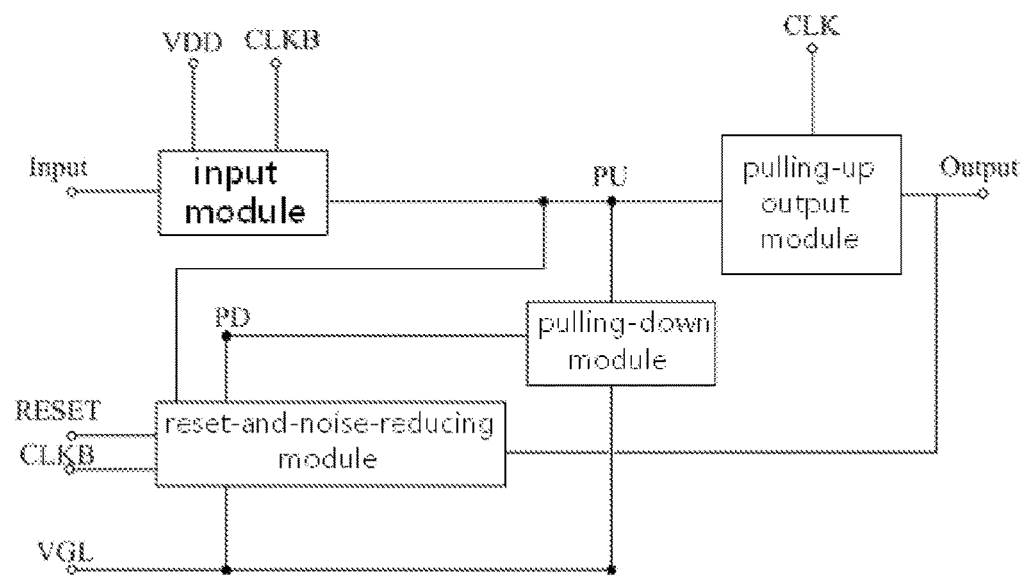
FIG. 2 is a structural schematic diagram of a shift register according to a first embodiment of the present invention.

As shown in FIG. 2, the present embodiment provides a shift register, which includes an input module, an output pulling-up module and a reset-and-noise-reducing module. The input module is connected to a signal input terminal Input, a second clock signal input terminal CLKB, a power supply voltage terminal VDD and a pulling-up node PU, and is used to charge the pulling-up node PU through a power supply voltage inputted from the power supply voltage terminal VDD and a signal inputted from the signal input terminal Input, under the control of the signal inputted from the signal input terminal Input and a second clock signal inputted from the second clock signal input terminal CLKB, the pulling-up node PU being a connection node between the input module and the output pulling-up module. The output pulling-up module is connected to a first clock signal input terminal CLK, the pulling-up node PU and a signal output terminal Output, and is used to pull up a potential at the signal output terminal Output in accordance with a potential at the pulling-up node PU. The reset-and-noise-reducing module is connected to the second clock signal input terminal CLKB, a reset signal input terminal RESET, a low voltage terminal VGL, the pulling-up node PU, a pulling-down node PD and the signal output terminal Output, and is used to reset the pulling-up node PU and a signal outputted from the signal output terminal Output and reduce output noise through a low-voltage signal inputted from the low voltage terminal VGL, under the control of the second clock signal inputted from the second clock signal input terminal CLKB and a reset signal inputted from the reset signal input terminal RESET.

The shift register provided by the present embodiment has a simple structure, thereby facilitating the implementation of a narrow-bezel display device.

The shift register according to the present embodiment may further include a pulling-down module. The pulling-down module is connected to a pulling-down node PD, the pulling-up node PU and the low voltage terminal VGL, and is used to pull down a potential at the pulling-down node PD through the low-voltage signal inputted from the low voltage terminal VGL, under the control of the pulling-up node PU, to prevent an influence on an output of the signal output terminal Output of the shift register; wherein the pulling-down node PD is a connection node between the reset-and-noise-reducing module and the pulling-down module.

Figure 4:
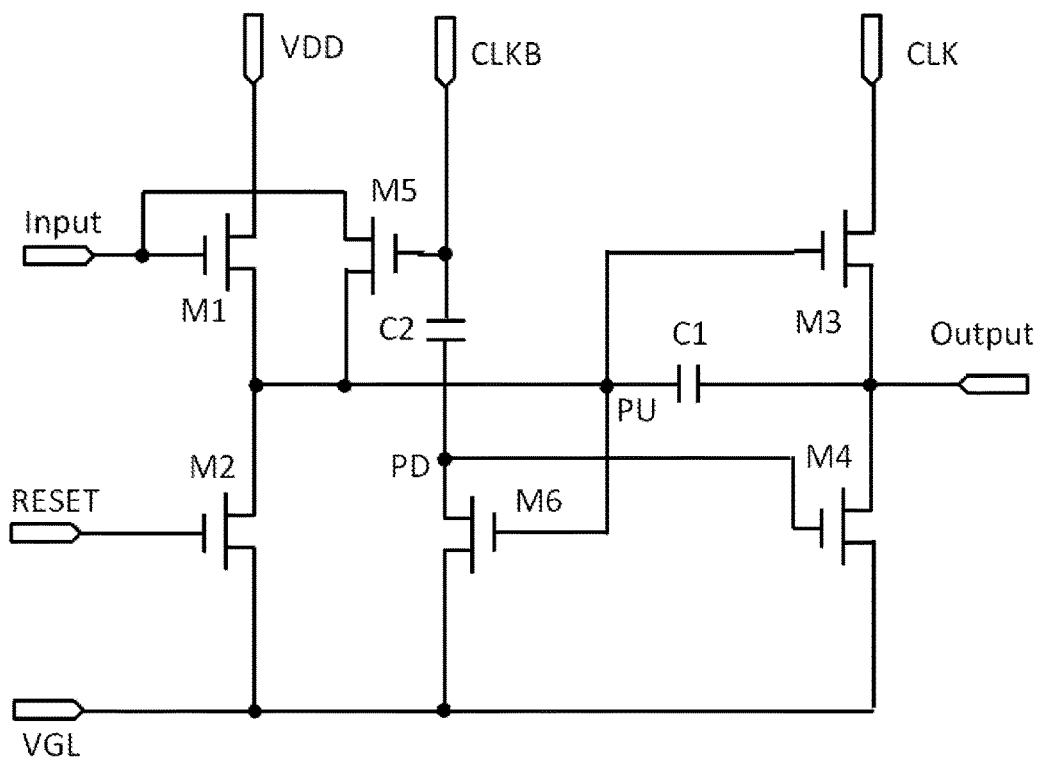
FIG. 4 is a circuit diagram of the shift register as shown in FIG. 2.

FIG. 4 shows a circuit diagram of the shift register. As shown in FIG. 4, the input module includes a first transistor M1 and a fifth transistor M5. A first electrode of the first transistor M1 is connected to the power supply voltage terminal VDD, a second electrode of the first transistor M1 is connected to the pulling-up node PU, and a control electrode of the first transistor M1 is connected to the signal input terminal Input. A first electrode of the fifth transistor M5 is connected to the signal input terminal Input, a second electrode of the fifth transistor M5 is connected to the pulling-up node PU, and a control electrode of the fifth transistor M5 is connected to the second clock signal input terminal CLKB.

Specifically, since the input module in the present embodiment includes the first transistor M1 and the fifth transistor M5, the first transistor M1 and the fifth transistor M5 are turned on when the signals inputted from the signal input terminal Input and the second clock signal input terminal CLKB are of high level, a power supply voltage is inputted from the power supply terminal and the pulling-up node PU is charged through the first transistor M1, and at the same time, the pulling-up node PU is also charged through the fifth transistor M5 by the high-level signal inputted from the signal input terminal Input, thereby significantly improving the ability of the shift register for charging the pulling-up node PU.

As shown in FIG. 4, the output pulling-up module includes a third transistor M3 and a first storage capacitor C1. A first electrode of the third transistor M3 is connected to the first clock signal input terminal CLK, a second electrode of the third transistor M3 is connected to the signal output terminal Output, and a control electrode of the third transistor M3 is connected to the pulling-up node PU. A first end of the first storage capacitor C1 is connected to the pulling-up node PU, and a second end of the first storage capacitor C1 is connected to the signal output terminal Output.

Specifically, the third transistor M3 is turned on when the pulling-up node PU is pulled up to a high level, and a high-level signal is inputted from the first clock signal input terminal CLK; at this time, a potential at the signal output terminal Output is pulled up to high.

As shown in FIG. 4, the reset-and-noise-reducing module includes a second transistor M2, a fourth transistor M4 and a second storage capacitor C2. A first electrode of the second transistor M2 is connected to the pulling-up node PU, a second electrode of the second transistor M2 is connected to the low-voltage terminal VGL, and a control electrode of the second transistor M2 is connected to the reset signal input terminal RESET. A first electrode of the fourth transistor M4 is connected to the signal output terminal Output, a second electrode of the fourth transistor M4 is connected to the low voltage terminal VGL, and a control electrode of the fourth transistor M4 is connected to the pulling-down node PD. A first end of the second storage capacitor C2 is connected to the second clock signal input terminal CLKB, and a second end of the second storage capacitor C2 is connected to the pulling-down node PD.

Specifically, when the signals inputted from the reset signal input terminal RESET and the second clock signal input terminal CLKB are of high level, the second transistor M2 is turned on and the potential at the pulling-up node PU is pulled down, so that the pulling-up node PU is reset; at the same time, a potential of the second end (i.e., the pulling-down node PD) of the second storage capacitor C2 is pulled up due to the bootstrapping effect of the second storage capacitor C2, and the fourth transistor M4 is turned on, so the signal output terminal Output is reset through the fourth transistor M4 and the noise thereof is reduced.

As shown in FIG. 4, the pulling-down module includes a sixth transistor M6. A first electrode of the sixth transistor M6 is connected to the pulling-down node PD, a second electrode of the sixth transistor M6 is connected to the low voltage terminal VGL, and a control electrode of the sixth transistor M6 is connected to the pulling-up node PU.

Specifically, the sixth transistor M6 is turned on when the pulling-up node PU is of high level, and, at this time, a potential of the pulling-down node PD is pulled down and the fourth transistor M4 is turned off, so as to prevent a change of the signal outputted from the signal output terminal Output due to a leakage of the fourth transistor M4.

Figure 5:
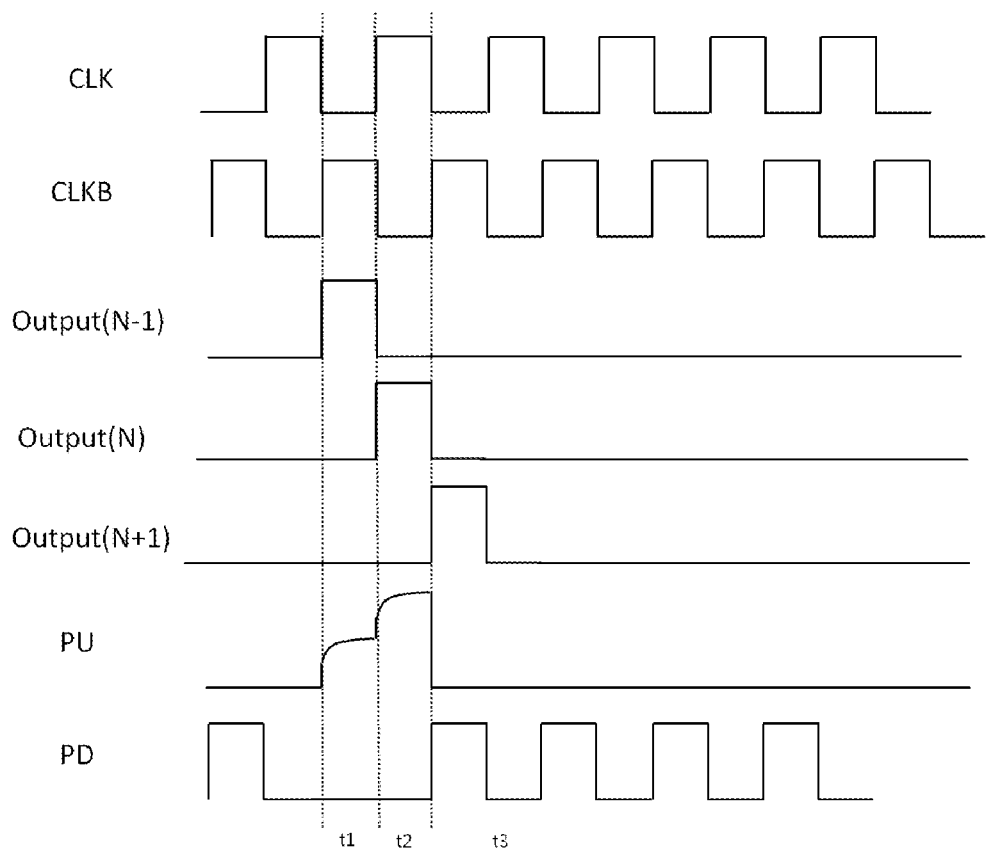
FIG. 5 is an operating timing diagram of the shift register as shown in FIG. 4.

An operating process of the shift register of FIG. 4 will be described in detail below in conjunction with a timing diagram shown in FIG. 5. The operating process may be divided into a pre-charging period, an outputting period and a resetting-and-noise-reducing period. When a plurality of the shift registers shown in FIG. 4 are cascaded, for the N-th stage of the shift register, the signal input terminal Input thereof is connected to the signal output terminal Output (N−1) of the (N−1)-th stage of the shift register, and the reset signal input terminal RESET thereof is connected to the signal output terminal Output(N+1) of the (N+1)-th stage of the shift register.

In the pre-charging period t1, the signals inputted from the signal input terminal Input of the input module and from the second clock signal input terminal CLKB are of high level, and the pulling-up node is charged through the power supply voltage inputted from the power supply voltage terminal VDD and the high-level signal inputted from the signal input terminal Input.

Specifically, the signal inputted from the signal input terminal Input is of high level, and thus causes the first transistor M1 to be turned on. The pulling-up node PU (i.e., the first end of the first storage capacitor C1) is charged through the first transistor M1 by the power supply voltage inputted from the power supply voltage terminal VDD, so that the voltage at the pulling-up node PU is pulled up. At this time, the signal inputted from the second clock signal input terminal CLKB is of high level and the fifth transistor M5 is turned on, so that the pulling-up node PU is charged through the fifth transistor M5 by the signal inputted from the signal input terminal Input, thereby significantly improving the ability of the shift register for charging the pulling-up node PU. At this time, since the sixth transistor M6 is turned on due to the high level at the pulling-up node PU, the potential at the pulling-down node PD is pulled down to low. The fourth transistor M4 is turned off due to the low level at the pulling-down node PD, thereby ensuring the stability of the low-level signal outputted from the signal output terminal Output.

In the outputting period t2, the output pulling-up module is turned on by the high level at the pulling-up node, and the voltage at the signal output terminal Output is pulled up through the signal inputted from the first clock signal input terminal CLK.

Specifically, the signal inputted from the signal input terminal Input is of low level, the first transistor M1 is turned off, and the fifth transistor M5 is in an off state due to the low-level signal inputted from the second clock signal input terminal CLKB, so that the pulling-up node PU still maintains a high level, and thus the third transistor M3 maintains an on state; at this time, the signal inputted from the first clock signal input terminal CLK is of high level, so that a high-level driving signal is outputted from the signal output terminal Output, and the voltage at the pulling-up node PU is increased due to the bootstrapping effect. At this time, since the pulling-up node PU is of high potential, the sixth transistor M6 maintains to be on and the pulling-down node PD maintains the low potential, so that the fourth transistor M4 maintains to be off, and the stability of the high-level signal outputted form the signal output terminal Output is ensured due to the off state of the fifth transistor M5.

In the reset-and-noise reducing period t3, the pulling-up node and the signal outputted from the signal output terminal Output are reset and the noise thereof is reduced through the low-voltage signal inputted from the low voltage terminal VGL, under the control of the second clock signal inputted from the second clock signal input terminal CLKB and the reset signal inputted from the reset signal input terminal RESET.

Specifically, the signal inputted from the reset signal input terminal RESET is of high level, and thus causes the second transistor M2 to be in the on state, and the potential at the pulling-up node PU is pulled down such that the third transistor M3 and the sixth transistor M6 are turned off; at the same time, the signal inputted from the second clock signal input terminal CLKB is of high level as well, and because the sixth transistor M6 is in the off state, the potential at the pulling-down node PD is pulled up to a high level through the bootstrapping effect of the second storage capacitor C2, and thus the fourth transistor M4 is in the on state, and the signal outputted from the signal output terminal Output is pulled down to a low potential so as to realize the reset of the shift register.

Next, in the case that the signal inputted from the reset signal input terminal RESET is of low level, the fifth transistor M5 is turned on when the signal inputted from the second clock signal input terminal CLKB is of high level, and the potential of the pulling-up node PU is pulled down; at this time, the sixth transistor M6 is turned off, and the pulling-down node PD, by the joint action of the second storage capacitor C2 and the signal inputted from the second clock signal input terminal CLKB, is pulled up to a high potential, and the fourth transistor M4 is turned on to reduce the noise at the signal output terminal Output. Since the signal inputted from the signal input terminal Input is of low level and the signal inputted from the second clock signal input terminal CLKB is of high level and the fifth transistor M5 is turned on, the noise reduction for the potential at the pulling-up node PU may be performed to eliminate the noise voltage generated from the first clock signal input terminal CLK, thereby implementing the low-voltage output of the signal output terminal Output and ensuring the stability of the signal outputting.

The shift register would have been in the resetting-and-noise-reducing period until the arrival of the signal for the next frame of image, so as to continuously perform the noise reduction for the gate circuit.

Figure 3:
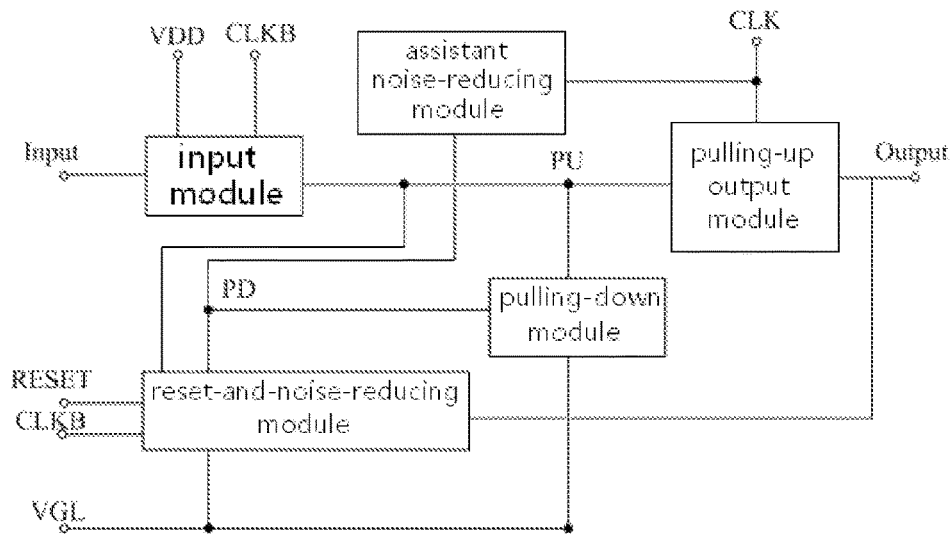
FIG. 3 is a structural schematic diagram of another shift register according to the first embodiment of the present invention.

FIG. 3 shows another implementation of the shift register provided by the present embodiment. Compared to the shift register shown in FIG. 2, the difference of the shift register shown in FIG. 3 is that the shift register further includes an assistant noise-reducing module. The assistant noise-reducing module is connected to the first clock signal input terminal CLK and the reset-and-noise-reducing module, and is used to assist the reset-and-noise-reducing module to perform the operation of reset and noise reduction for the pulling-up node PU and the signal output terminal Output, under the control of the first clock signal inputted from the first clock signal input terminal CLK. The description of the modules which are the same as those of the shift registers shown in FIG. 2 is omitted herein.

Figure 6:
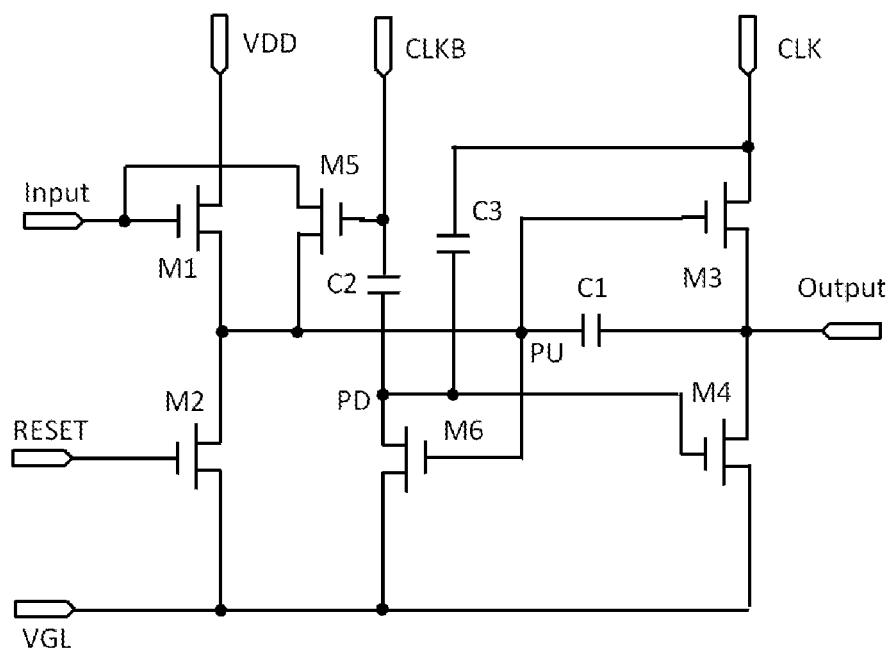
FIG. 6 is a circuit diagram of the shift register as shown in FIG. 3.

FIG. 6 shows a specific circuit diagram of the shift register. As shown in FIG. 6, the assistant noise-reducing module includes a third storage capacitor C3. A first end of the third storage capacitor C3 is connected to the first clock signal input terminal CLK, and a second end of the third storage capacitor C3 is connected to the control electrode of the fourth transistor M4 (i.e., the pulling-down node PD).

Figure 7:
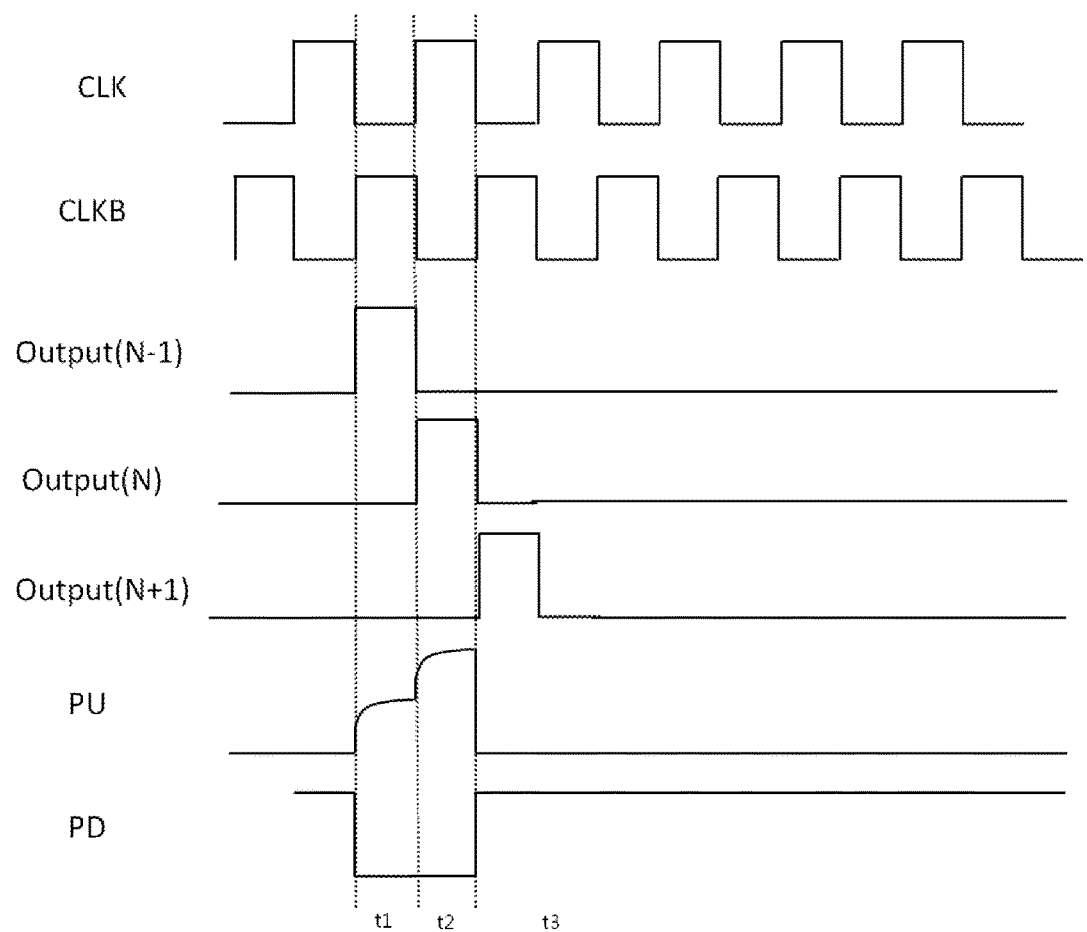
FIG. 7 is an operating timing diagram of the shift register as shown in FIG. 6.

An operating process of the shift register of FIG. 6 will be described in detail below in conjunction with a timing diagram shown in FIG. 7. The operating process may be divided into a pre-charging period, an outputting period and a resetting-and-noise-reducing period. When a plurality of the shift registers shown in FIG. 6 are cascaded, for the N-th stage of the shift register, the signal input terminal Input thereof is connected to the signal output terminal Output (N−1) of the (N−1)-th stage of the shift register, and the reset signal input terminal RESET thereof is connected to the signal output terminal Output(N+1) of the (N+1)-th stage of the shift register.

In the pre-charging period t1, the signals inputted from the signal input terminal Input of the input module and from the second clock signal input terminal CLKB are of high level, and the pulling-up node is charged through the power supply voltage inputted from the power supply voltage terminal VDD and the high-level signal inputted from the signal input terminal Input.

Specifically, the signal inputted from the signal input terminal Input is of high level, and thus causes the first transistor M1 to be turned on. The pulling-up node PU (i.e., the first end of the first storage capacitor C1) is charged through the first transistor M1 by the power supply voltage inputted from the power supply voltage terminal VDD, so that the voltage at the pulling-up node PU is pulled up. At this time, the signal inputted from the second clock signal input terminal CLKB is of high level and the fifth transistor M5 is turned on, so that the pulling-up node PU is charged through the fifth transistor M5 by the signal inputted from the signal input terminal Input, thereby significantly improving the ability of the shift register for charging the pulling-up node PU. At this time, since the sixth transistor M6 is turned on due to the high level at the pulling-up node PU, the potential at the pulling-down node PD is pulled down to a low level. The fourth transistor M4 is turned off due to the low level at the pulling-down node PD, thereby ensuring the stability of the low-level signal outputted from the signal output terminal Output.

In the outputting period t2, the output pulling-up module is turned on by the high level at the pulling-up node, and the voltage at the signal output terminal Output is pulled up through the signal inputted from the first clock signal input terminal CLK.

Specifically, the signal inputted from the signal input terminal Input is of low level, and the first transistor M1 is turned off, so that the pulling-up node PU continues to maintain a high level, and thus the third transistor M3 maintains the on state; at this time, the signal inputted from the first clock signal input terminal CLK is of high level, so that a high-level driving signal is outputted from the signal output terminal Output, and the voltage at the pulling-up node PU is increased due to the bootstrapping effect. At this time, since the pulling-up node PU is of high potential, the sixth transistor M6 maintains to be on and the pulling-down node PD maintains the low potential, so that the fourth transistor M4 maintains to be off, and the stability of the high-level signal outputted form the signal output terminal Output is ensured due to the off state of the fifth transistor M5.

In the reset-and-noise reducing period t3, the pulling-up node and the signal outputted from the signal output terminal Output are reset and the noise thereof is reduced through the low-voltage signal inputted from the low voltage terminal VGL, under the control of the second clock signal inputted from the second clock signal input terminal CLKB and the reset signal inputted from the reset signal input terminal RESET.

Specifically, the signal inputted from the reset signal input terminal RESET is of high level, and thus causes the second transistor M2 to be in the on state, and the voltage level at the pulling-up node PU is pulled down such that the third transistor M3 and the sixth transistor M6 are turned off; at the same time, the signal inputted from the second clock signal input terminal CLKB is of high level as well, and because the sixth transistor M6 is in the off state, the potential at the pulling-down node PD is pulled up to a high level through the bootstrapping effect of the second storage capacitor C2, and thus the fourth transistor M4 is in the on state, and the signal outputted from the signal output terminal Output is pulled down to a low potential so as to realize the reset of the shift register.

Since the shift register shown in FIG. 6 has an assistant noise-reducing module which includes the third storage capacitor C3, when the signal inputted from the first clock signal input terminal CLK is of high level and the signal inputted from the second clock signal input terminal CLKB is of low level, the voltage at the pulling-up node PU is pulled down to a low level, and the pulling-down node PD is pulled up to a high level due to the bootstrapping effect of the third storage capacitor C3, and, at this time, the fourth transistor M4 is turned on to reduce the noise of the signal outputted from the signal output terminal Output.

Next, in the case that the signal inputted from the reset signal input terminal RESET is of low level, the fifth transistor M5 is turned on when the signal inputted from the second clock signal input terminal CLKB is of high level, and the potential of the pulling-up node PU is pulled down; at this time, the sixth transistor M6 is turned off, and the pulling-down node PD, by the joint action of the second storage capacitor C2 and the signal inputted from the second clock signal input terminal CLKB, is pulled up to a high potential, and the fourth transistor M4 is turned on to reduce the noise at the signal output terminal Output. Since the signal inputted from the signal input terminal Input is of low level and the signal inputted from the second clock signal input terminal CLKB is of high level and the fifth transistor M5 is turned on, the noise reduction for the voltage level at the pulling-up node PU may be performed to eliminate the noise voltage generated from the first clock signal input terminal CLK, thereby implementing the low-voltage output of the signal output terminal Output and ensuring the stability of the signal outputting.

The shift register would have been in the resetting-and-noise-reducing period until the arrival of the signal for the next frame of image, so as to continuously perform the noise reduction for the gate circuit.

Second Embodiment

Figure 8:
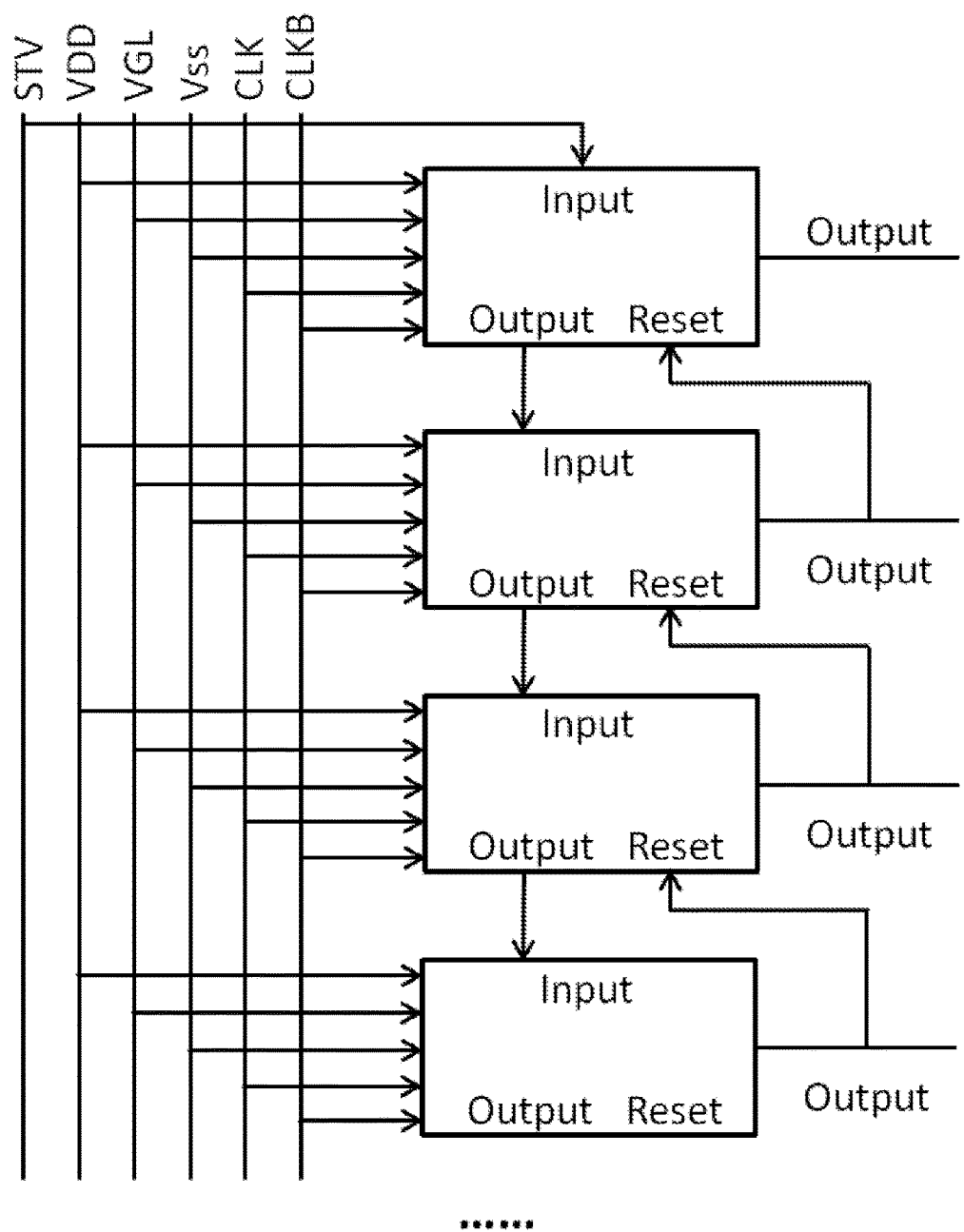
FIG. 8 is a schematic diagram of a gate driving circuit according to a second embodiment of the present invention.

As shown in FIG. 8, the present embodiment provides a gate driving circuit which includes a plurality of cascaded shift registers, where the shift registers are shift registers according to the first embodiment; wherein, for each stage of the shift register, the signal input terminal Input thereof is connected to the signal output terminal Output of the previous stage of the shift register, and the reset signal input terminal Reset thereof is connected to the signal output terminal Output of the next stage of the shift registers.

Third Embodiment

The present embodiment provides a display device which includes the gate driving circuit according to the second embodiment, thereby implementing a narrow-bezel design of the display device.

The display device may be any product or component with the function of display, such as a mobile phone, a tablet computer, a television, a display, a notebook computer, a digital photo frame, a navigator or the like.

Apparently, the display device of the present embodiment may further include other common structures such as a power supply unit, a display driving unit and the like.

It can be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

What is claimed is:

1. A shift register, comprising:
an input module, which comprises a first transistor and a fifth transistor, a first electrode of the first transistor being connected to a power supply voltage terminal, a second electrode of the first transistor being connected to a pulling-up node, a control electrode of the first transistor being connected to a signal input terminal, a first electrode of the fifth transistor being connected to the signal input terminal, a second electrode of the fifth transistor being connected to the pulling-up node, and a control electrode of the fifth transistor being connected to a second clock signal input terminal;
an output pulling-up module, which comprises a third transistor and a first storage capacitor, a first electrode of the third transistor being connected to a first clock signal input terminal, a second electrode of the third transistor being connected to a signal output terminal, a control electrode of the third transistor being connected to the pulling-up node, a first end of the first storage capacitor being connected to the pulling-up node, and a second end of the first storage capacitor being connected to the signal output terminal;

a reset-and-noise-reducing module, which comprises a second transistor, a fourth transistor and a second storage capacitor, a first electrode of the second transistor being connected to the pulling-up node, a second electrode of the second transistor being connected to a low voltage terminal, a control electrode of the second transistor being connected to a reset signal input terminal, a first electrode of the fourth transistor being connected to the signal output terminal, a second electrode of the fourth transistor being connected to the low voltage terminal, a control electrode of the fourth transistor being connected to a pulling-down node, a first end of the second storage capacitor being connected to the second clock signal input terminal, and a second end of the second storage capacitor being connected to the control electrode of the fourth transistor; and a pulling-down module, which comprises a sixth transistor having a first electrode connected to the pulling-down node, a second electrode connected to the low voltage terminal, and a control electrode connected to the pulling-up node, wherein;

the reset-and-noise-reducing module is configured to turn on the fourth transistor by means of a bootstrapping of the second storage capacitor in a case where a reset signal inputted from the reset signal input terminal and a second clock signal inputted from the second clock signal input terminal are both at a first level, such that the signal output terminal is discharged to a second level via only the fourth transistor, the second level being different from the first level.

2. The shift register according to claim 1, further comprising an assistant noise-reducing module, wherein, the assistant noise-reducing module is connected to the first clock signal input terminal and the reset-and-noise-reducing module, and is used to assist the reset-and-noise-reducing module to perform the reset and noise reduction for the pulling-up node and the signal output terminal, under the control of a first clock signal inputted from the first clock signal input terminal.

3. The shift register according to claim 2, wherein the assistant noise-reducing module includes a third storage capacitor, and a first end of the third storage capacitor is connected to the first clock signal input terminal, and a second end of the third storage capacitor is connected to the pulling-down node.

4. A method for driving the shift register according to claim 1, the method comprising steps of:

inputting, in a pre-charging period, high-level signals from the signal input terminal of the input module and the second clock signal input terminal, and charging the pulling-up node through the power supply voltage inputted from the power supply voltage terminal and the high-level signal inputted from the signal input terminal;

turning on, in an outputting period, the output pulling-up module by the pulling-up node, and pulling up a voltage at the signal output terminal through a signal inputted from the first clock signal input terminal; and with the second clock signal of the first level inputted from the second clock signal input terminal and the reset signal of the first level inputted from the reset signal input terminal, resetting the pulling-up node and reducing the noise thereof; through the low-voltage signal inputted from the low voltage terminal, and turning on the fourth transistor by means of a bootstrapping of the second storage capacitor such that the signal output terminal is discharged to the second level via only the fourth transistor, the second level being different from the first level.

5. A gate driving circuit, comprising a plurality of cascaded shift registers according to claim 1.

6. A display device, comprising the gate driving circuit according to claim 5.

* * * * *